United States Patent
Hsu et al.

(10) Patent No.: US 7,039,853 B2
(45) Date of Patent: May 2, 2006

(54) MULTI-MODE REED-SOLOMON DECODER BASED UPON THE PGZ ALGORITHM AND ASSOCIATED METHOD

(75) Inventors: H. Y. Hsu, Taipei (TW); S. F. Wanf, Taipei (TW); Anyeu Wu, Taipei (TW); Howen Chen, Taipei (TW)

(73) Assignee: VIA Technologies, Inc., Taipei (TW)

( * ) Notice: Subject to any disclaimer, the term of this patent is extended or adjusted under 35 U.S.C. 154(b) by 466 days.

(21) Appl. No.: 10/302,825

(22) Filed: Nov. 25, 2002

(65) Prior Publication Data

US 2003/0135810 A1    Jul. 17, 2003

(30) Foreign Application Priority Data

Jan. 17, 2002    (TW)    ............................... 91100683 A

(51) Int. Cl.
*H03M 13/00*    (2006.01)
(52) U.S. Cl. ...................................................... 714/784
(58) Field of Classification Search ........ 714/781–786, 714/755–756, 762, 793

See application file for complete search history.

(56) References Cited

OTHER PUBLICATIONS

Srinivasan et al., Malfunction in the Peterson-Gorenstein-Zierler Decoder, Sep. 1994, IEEE Trans. on Info. Theory, vol. 40, No. 5, pp. 1649-1653.*

Arne Dur, Avoiding decoder malfunction in the Peterson-Gorenstein-Zierler Decoder, Mar. 1993, IEEE Trans. on Info. THeory, vol. 39, No. 2, pp. 640-643.*

Shahzad et al., Self correcting codes conquer noise Part 2: Reed-Solomon codecs, Mar. 2001, EDN, www.ednmag.com, pp. 107-120.*

\* cited by examiner

*Primary Examiner*—Shelly Chase
(74) *Attorney, Agent, or Firm*—Bacon & Thomas, PLLC

(57) ABSTRACT

A multi-mode Reed-Solomon decoder is disclosed. According to the invention, by simplifying the Peterson-Gorenstein-Zierler (PGZ) algorithm the goal of correcting different numbers of errors ($t \leq 3$) using a single hardware architecture is achieved. Through optimization without requiring finite field inversion operations, the hardware and the computing efficiency are both improved. The invention also discloses a register transistor level (RTL) hardware architecture to applied in error control codes (ECC) between a processor and a memory and other high-speed communication systems.

7 Claims, 8 Drawing Sheets

MULTI-MODE REED-SOLOMON DECODER BASED UPON THE PGZ ALGORITHM AND ASSOCIATED METHOD

BACKGROUND OF THE INVENTION

1. Field of Invention

The invention relates to a Reed-Solomon decoder. More particularly, the invention relates to a multi-mode Reed-Solomon decoder based upon the Peterson-Gorenstein-Zierler (PGZ) algorithm.

2. Related Art

The Reed-Solomon (RS) codes have a strong error-correcting ability for burst transmission errors. Therefore, the RS codes have been widely used for error correction in digital communication and storage systems such as the xDSL, the cable modem, between a processor and a memory, the CD and the DVD.

Among various RS decoding algorithms, the Peterson-Gorenstein-Zierler (PGZ) algorithm provides the simplest method for implementing a RS decoder for $t \leq 3$. This is a low-cost solution for such systems as the error control code (ECC) between a processor and a memory that requires smaller error-correcting ability. Unlike an iterated RS decoding algorithm, such as the Berlekamp-Massey algorithm, the main drawback of the conventional PGZ algorithm is that it can perform only single mode correction. In other words, the PGZ decoding circuit for $t=3$ cannot make $t=1,2$ correction. Therefore, a PGZ decoding circuit for $t \leq 3$ conventionally requires three sets of different circuits to compute the $t=1$, $t=2$, and $t=3$ corrections independently, as shown in the circuit block diagram of FIG. 2.

Apparently, implementing three sets of hardware circuits in an IC is a burden for manufacturing cost and chip design. To implement the Reed-Solomon decoder using the conventional PGZ algorithm, individual hardware circuits for different error corrections are required (the number of error correction abilities $t=0,1,2,3 \ldots$ ). As the number of error codes increases, the required chip area also grows exponentially. This inevitably increases the manufacturing cost and lowers the efficiency of the hardware utility. In addition, the Reed-Solomon decoder has a finite field inverter (FFI), which occupies a large area and needs a long calculation time. With the increasing error-correcting abilities, the circuit design becomes very complicated. Moreover, the number of required finite field adders (FFA) and finite field multipliers (FFM) grows exponentially.

SUMMARY OF THE INVENTION

In view of the foregoing, the invention provides a VLSI architecture to build a multi-mode Reed-Solomon decoder that can perform all sorts of corrections using the PGZ algorithm.

An objective of the invention is to provide a multi-mode Reed-Solomon decoder that can make corrections in response to error situations based upon the PGZ algorithm.

Another objective of the invention is to provide a multi-mode PGZ decoder circuit in a VLSI architecture that has a lower cost and uses fewer area resources to solve various error correction problems.

A further objective of the invention is to provide an improved Reed-Solomon decoder based upon the PGZ algorithm that modifies the hardware circuit with error-correcting ability $t=3$, so that the circuit has the abilities to solve all $t=0,1,2,3$ errors.

For the implementation of a Reed-Solomon decoder based on the PGZ algorithm in the prior art, the VLSI architecture uses the redundant hardware circuits to achieve various types of error corrections ($t=1$, $t=2$, and $t=3$). The implementation requires a larger area and results in lowering the efficiency of hardware resources. Additionally, the implementation of the algorithm includes the operation of the FFI. This inevitably increases the complexity of the circuit calculation and deteriorates the calculation speed. Therefore, the invention ultilizes the derivation of the algorithm to obtain the disclosed Reed-Solomon decoder without requiring FFI. The occupied area resource is thus reduced, whereas the operation efficiency is enhanced. Furthermore, the invention improves the hardware circuit of the Reed-Solomon decoder with error-correcting ability $t=3$ based on the PGZ algorithm, so that it becomes a multi-mode PGZ decoder circuit that can process $t \leq 3$ error corrections.

In one embodiment of the present invention, a Reed-Solomon decoding method comprises the steps of: computing the syndromes of received data; solving the key equation; and evaluating error locations and error value, wherein the step for solving the key equation is based upon a simplified PGZ algorithm and a solution that does not need FFI in operations. This greatly reduces the complexity of the computation and the area resources occupied by the hardware. A multi-mode decoding method is employed to obtain the number of errors. Accordingly, the invention proposes a multi-mode PGZ decoding architecture that can process $t=0,1,2,3$ error corrections.

In another embodiment of the invention, the Reed-Solomon decoder comprising: a syndrome calculator to compute the syndromes of received data; a key equation solver to receive a syndrome equation from the syndrome calculator; and an error location and error value evaluator to receive the syndrome equation and obtain the error locations and error value. The key equation solver uses a simplified PGZ decoder as the basis thereof. The PGZ decoding architecture comprises FFA and FFM without requiring FFI. The PGZ decoder contains a multi-mode decoding controller for obtaining the number of errors so that the PGZ decoding architecture can process $t=0,1,2,3$ error corrections.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
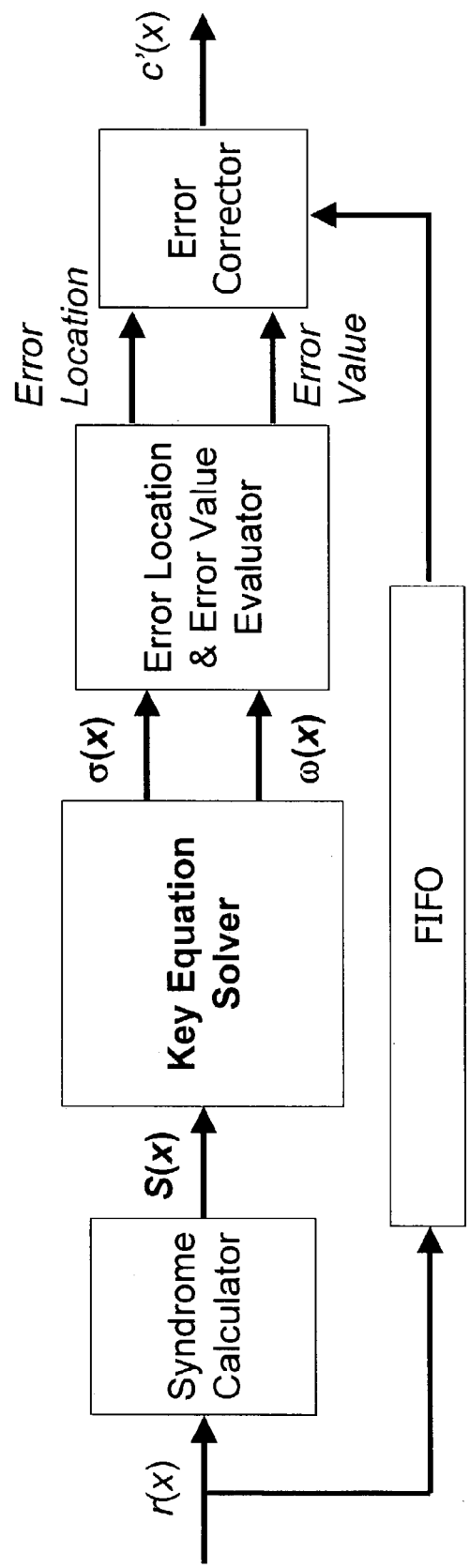
FIG. 1 shows a block diagram of the Reed-Solomon decoding procedure.

With reference to FIG. 1, a Reed-Solomon decoding procedure comprises computing the syndromes of a reception polynomial r(x) to obtain a syndrome polynomial S(x); solving the key equation to obtain an error location polynomial $\sigma(x)$ and an error value polynomial $\omega(x)$ in accordance with the syndrome polynomial S(x); evaluating error locations and error value in accordance with the error location polynomial $\sigma(x)$ and the error value polynomial $\omega(x)$; and correcting the errors in the received data in accordance with the error locations and the error value to obtain a transmitted codeword polynomial c(x).

In the above-mentioned procedure, the transmitted codeword polynomial c(x) and the reception polynomial r(x) can be related by the following expression:

$$r(x)=c(x)+e(x), \quad (1)$$

where e(x) represents the error pattern. The syndrome values $S_i$ obtained from $\alpha^i$ in the reception polynomial r(x) can be expressed as:

$$S_i = r(\alpha^i) = \sum_{j=0}^{n-1} r_j(\alpha^i)^j, \quad 1 \le i \le 2t. \quad (2)$$

Therefore, the syndrome polynomial S(x) is defined as:

$$S(x) = \sum_{i=0}^{2t-1} S_{i+1} x^i. \quad (3)$$

The PGZ algorithm for solving the key equation includes the step of solving the Newton Identity:

$$\begin{bmatrix} S_2 & S_3 & \cdots & S_{t+1} \\ S_3 & S_4 & \cdots & S_{t+2} \\ \vdots & \vdots & \ddots & \vdots \\ S_{t+1} & S_{t+2} & \cdots & S_{2t} \end{bmatrix} \begin{bmatrix} \sigma_{t-1} \\ \sigma_{t-2} \\ \vdots \\ \sigma_0 \end{bmatrix} = \begin{bmatrix} -S_1 \\ -S_2 \\ \vdots \\ -S_t \end{bmatrix} \quad (4)$$

The syndrome values $S_i$ are used to solve for $\sigma$ in Eq. (4). The error location polynomial $\sigma(x)$ is defined as:

$$\sigma(x)=\sigma_0+\sigma_1 x+\ldots+\sigma_{t-1}x^{t-1}+x^t. \quad (5)$$

The key equation to be solved is shown in the following equation:

$$\sigma(x)S(x)=-\omega(x)+\mu\cdot x^{2t}, \quad (6)$$

where the error value polynomial $\omega(x)$ is defined as:

$$\omega(x)=\omega_0+\omega_1 x+\ldots+\omega_{t-1}x^{t-1}. \quad (7)$$

When t=1:

According to the PGZ algorithm, Eq. (8) is obtained from Eq. (4).

$$[S_2][\sigma_0] = [-S_1] \text{ and } \sigma_0 = \frac{S_1}{S_2} \quad (8)$$

Thus, the error location is computed as $$\sigma(x)=\sigma_0+x$$

Then the t=1 key equation could be solved $$\sigma(x)S(x)=-\omega(x)+\mu\cdot x^2 \; \omega(x)=-(\sigma_0+x)(S_1+S_2 x) \bmod x^2,$$

where the error value polynomial is $$\omega(x)=\omega_0 \text{ and } \omega_0=\sigma_0 S_1 \quad (9)$$

Figure 4:
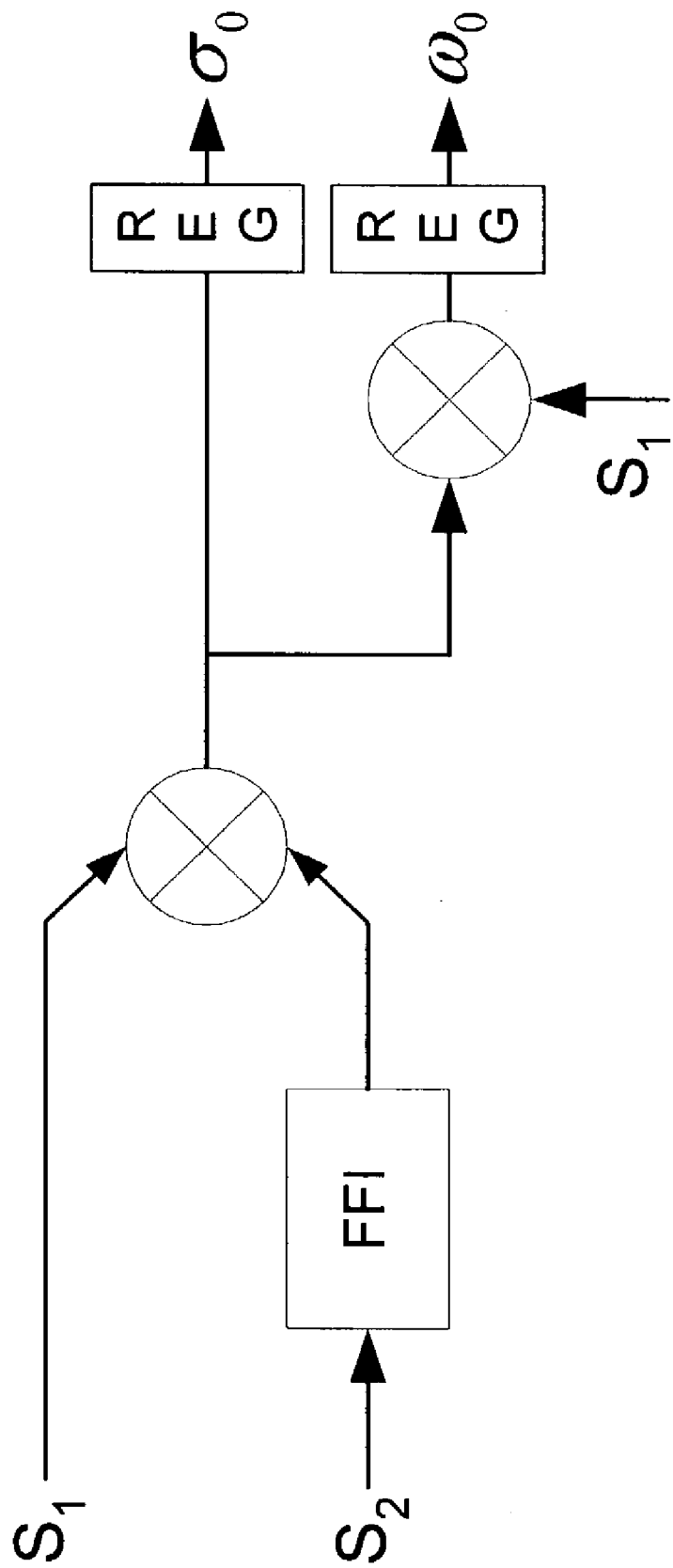
FIG. 4 shows an RTL hardware architecture of the $t=1$ PGZ decoding architecture.

For t=1, the register transistor level (RTL) hardware architecture that uses the foregoing PGZ algorithm to solve Eqs. (8) and (9) is shown in FIG. 4, including:

FFA×1; FFM×2; FFI×1

When t=2:

According to the PGZ algorithm, Eq. (10) is obtained from Eq. (4)

$$\begin{bmatrix} S_2 & S_3 \\ S_3 & S_4 \end{bmatrix} \begin{bmatrix} \sigma_1 \\ \sigma_0 \end{bmatrix} = \begin{bmatrix} -S_1 \\ -S_2 \end{bmatrix} \Rightarrow \sigma_0 = \frac{S_1 S_3 + (S_2)^2}{S_2 S_4 + (S_3)^2}, \sigma_1 = \frac{S_2 S_3 + S_1 S_4}{S_2 S_4 + (S_3)^2}. \quad (10)$$

The error value polynomial for solving the t=2 key equation is:

$$\omega(x)=\omega_0+\omega_1 x \text{ and } \omega_0=\sigma_0 S_1, \; \omega_1=\sigma_0 S_2+\sigma_1 S_1 \quad (11)$$

Figure 5:
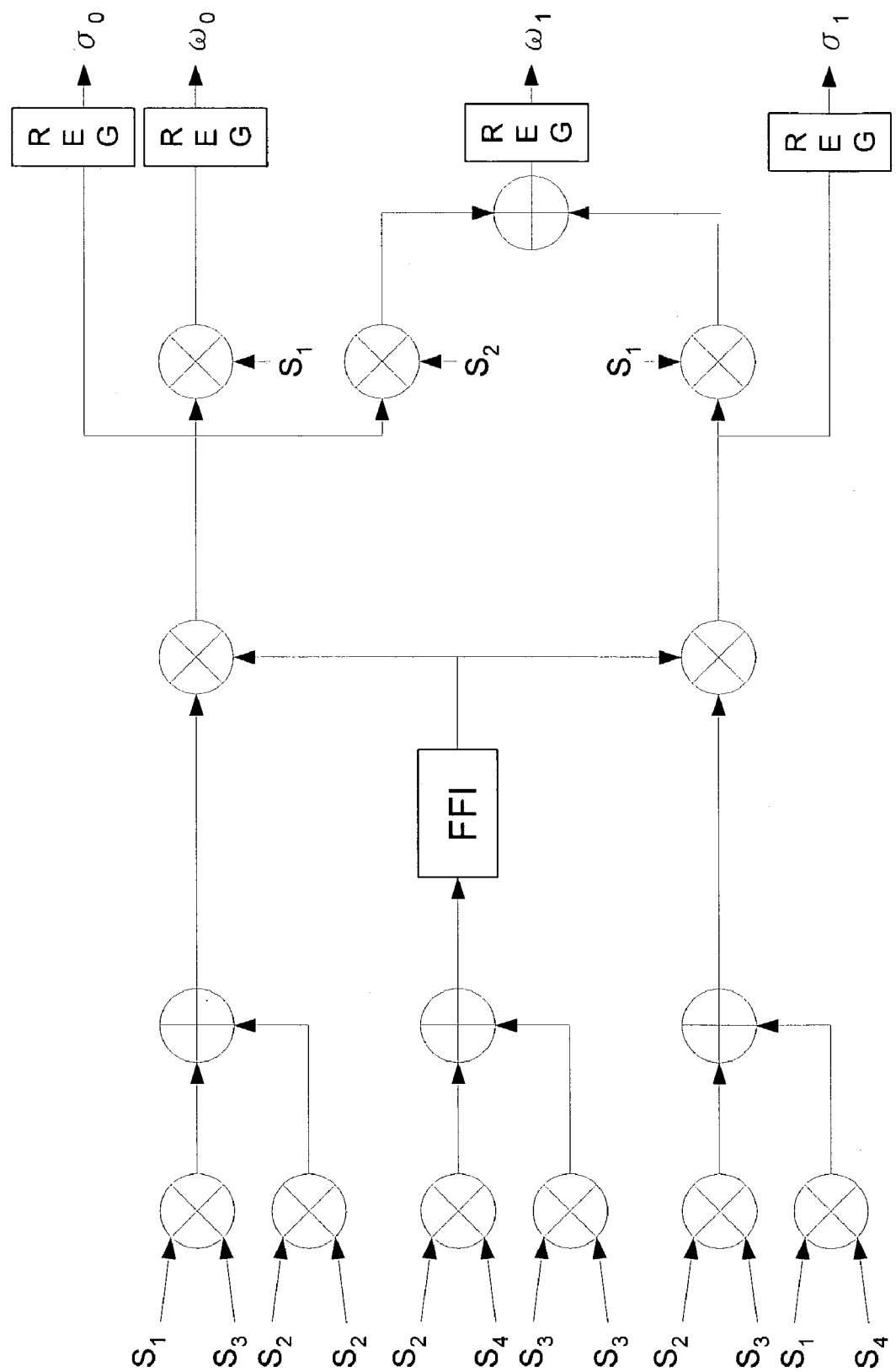
FIG. 5 shows an RTL hardware architecture of the $t=2$ PGZ decoding architecture.

For t=2, the RTL hardware architecture using the PGZ algorithm to solve Eqs. (10) and (11) is shown in FIG. 5, which includes:

FFA×4; FFM×1; FFI×1

When t=3:

According to the PGZ algorithm, Eq. (12) is obtained from Eq. (4):

$$\begin{bmatrix} S_2 & S_3 & S_4 \\ S_3 & S_4 & S_5 \\ S_4 & S_5 & S_6 \end{bmatrix} \begin{bmatrix} \sigma_2 \\ \sigma_1 \\ \sigma_0 \end{bmatrix} = \begin{bmatrix} -S_1 \\ -S_2 \\ -S_3 \end{bmatrix} \Rightarrow \quad (12)$$

$$\sigma_0 = \frac{S_2 S_3 S_4 + S_2 S_3 S_4 + S_1 S_3 S_5 + S_1 S_4 S_4 + S_2 S_2 S_5 + S_3 S_3 S_3}{S_2 S_4 S_6 + S_3 S_4 S_5 + S_3 S_4 S_5 + S_4 S_4 S_4 + S_3 S_3 S_6 + S_2 S_5 S_5}$$

$$\sigma_1 = \frac{S_2 S_2 S_6 + S_1 S_4 S_5 + S_3 S_3 S_4 + S_2 S_4 S_4 + S_1 S_3 S_6 + S_2 S_3 S_5}{S_2 S_4 S_6 + S_3 S_4 S_5 + S_3 S_4 S_5 + S_4 S_4 S_4 + S_3 S_3 S_6 + S_2 S_5 S_5}$$

$$\sigma_2 = \frac{S_1 S_4 S_6 + S_2 S_4 S_5 + S_3 S_3 S_5 + S_1 S_5 S_5 + S_2 S_3 S_6 + S_3 S_4 S_4}{S_2 S_4 S_6 + S_3 S_4 S_5 + S_3 S_4 S_5 + S_4 S_4 S_4 + S_3 S_3 S_6 + S_2 S_5 S_5}$$

The error value polynomial for solving the t=3 key equation is:

$$\omega(x)=\omega_0+\omega_1 x+\omega_2 x^2 \text{ and } \omega_0=\sigma_0 S_1, \; \omega_1=\sigma_0 S_2+\sigma_1 S_1,$$
$$\omega_2=\sigma_0 S_3+\sigma_1 S_2+\sigma_2 S_1 \quad (13)$$

For t=3, the RTL hardware architecture using the PGZ algorithm to solve Eqs. (12) and (13) includes:

FFA×19; FFM×49; FFI×1

Therefore, the Reed-Solomon decoder based upon the conventional PGZ algorithm requires a larger area in an IC and has a low hardware resource utilization. Furthermore, the implementation of the algorithm requires the FFI operations, which complicates the circuit design and deteriorates the calculation speed. The invention simplifies the algorithm so that the disclosed Reed-Solomon is less complicated in calculations. Furthermore, it requires no FFI operations when solving key equations. This can effectively reduce die size while increasing the calculation efficiency.

Figure 6:
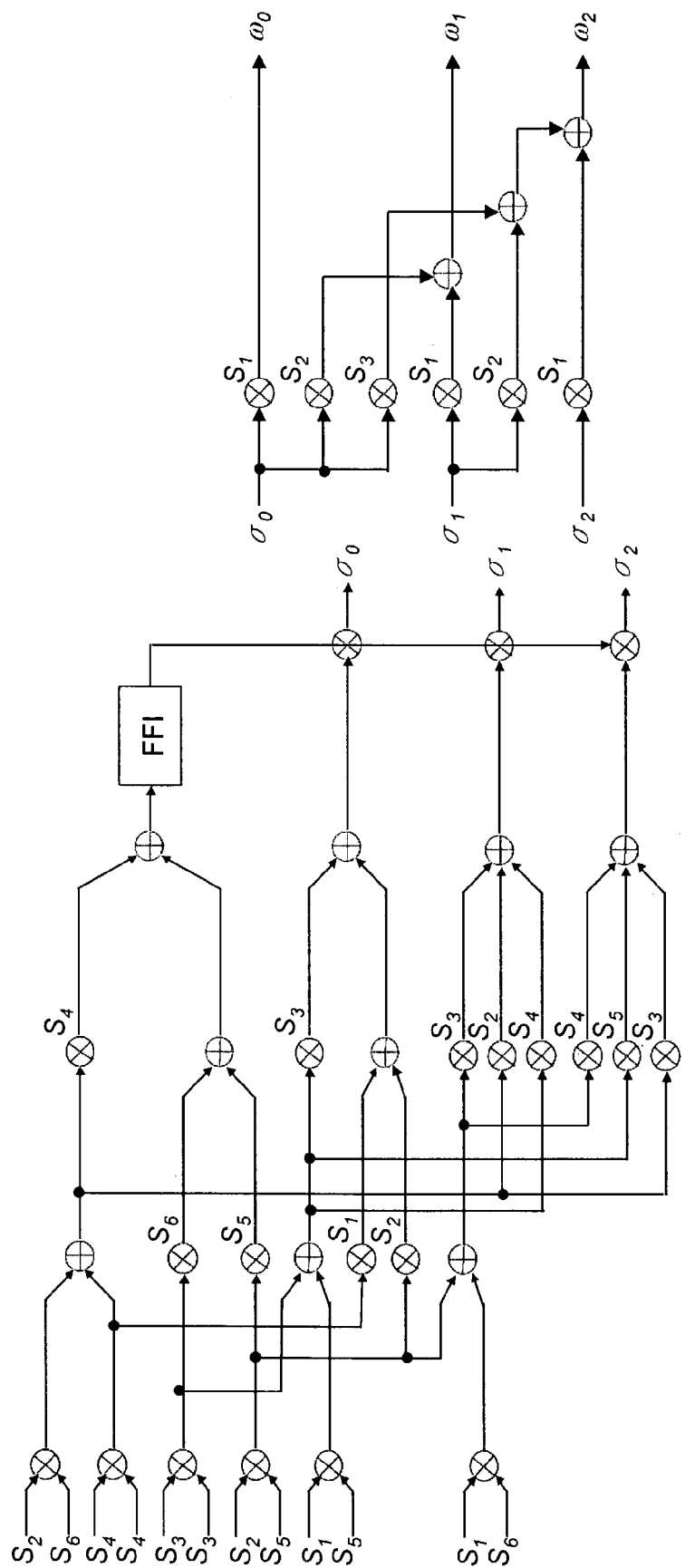
FIG. 6 shows an RTL hardware architecture of the simplified $t=3$ PGZ decoding architecture according to one embodiment of the present invention.

The Reed-Solomon decoding procedure further simplifies Eq. (12) in the t=3 PGZ algorithm according to the present invention. For the denominators of $\sigma_0$, $\sigma_1$, $\sigma_2$, two terms of $S_3S_4S_5$ are cancelled in FFA. Analogously, the numerator of $\sigma_0$ has two terms of $S_2S_3S_4$ that can be cancelled in FFA. In addition, the product terms $S_2S_2S_5$, $S_2S_3S_5$, $S_2S_4S_5$, $S_2S_5S_5$ of $\sigma_0$, $\sigma_1$, $\sigma_2$ in Eq. (12) have a common term $S_2S_5$. Therefore, the disclosed solving procedure first computes the value of $S_2S_5$ to reduce the calculation complexity. Other common terms $S_2S_6$, $S_4S_4$, $S_3S_3$, $S_1S_5$, and $S_1S_6$ can be similarly computed, too. In this manner, the RTL hardware architecture of Eqs. (12) and (13) solved using the PGZ algorithm for t=3 can be simplified (FIG. 6) to include:

FFA×12; FFM×27; FFI×1

Moreover, the solving process of the PGZ algorithm involves FFI operation. This does not only lower the computing speed of the hardware but also occupy die size area. Thus, the invention further simplifies the PGZ algorithm so as to reduce FFI operation 106.

With reference to Eq. (4), we further define the syndrome matrix $S_{t\times t}$, the error location vector $\sigma_{t\times 1}$, and the syndrome vector $s_{t\times 1}$ as follows:

$$S_{t\times t} = \begin{bmatrix} S_2 & S_3 & \cdots & S_{t+1} \\ S_3 & S_4 & \cdots & S_{t+2} \\ \vdots & \vdots & \ddots & \vdots \\ S_{t+1} & S_{t+2} & \cdots & S_{2t} \end{bmatrix}, \sigma_{t\times 1} = \begin{bmatrix} \sigma_{t-1} \\ \sigma_{t-2} \\ \vdots \\ \sigma_0 \end{bmatrix}, s_{t\times 1} = \begin{bmatrix} -S_1 \\ -S_2 \\ \vdots \\ -S_i \end{bmatrix}$$

Therefore, the Newton Identity can be expressed as $$S_{t\times t}\sigma_{t\times 1} = s_{t\times 1}, \quad (14)$$

and the determinant of the syndrome matrix $S_{t\times t}$ is denoted by $$A_t = \det(S_{t\times t}). \quad (15)$$

When multiplying the determinant $A_t$ by Eqs. (5) and (7), a new error location polynomial $\Phi(x)$ and a new error value polynomial $\Omega(x)$ are obtained. They can be expressed as:

$$\Phi(x) = A_t\sigma(x) = A_t\sigma_0 + A_t\sigma_1 x + \ldots + A_t\sigma_{t-1}x^{t-1} + A_t x^t$$

$$\Phi(x) = \Phi_0 + \Phi_1 x + \ldots + \Phi_{t-1}x^{t-1} + \Phi_t x^t \quad (16)$$

$$\Omega(x) = A_t\omega(x) = A_t\omega_0 + A_t\omega_1 x + \ldots + A_t\omega_{t-1}x^{t-1}$$

$$\Omega(x) = \Omega_0 + \Omega_1 x + \ldots + \Omega_{t-1}x^{t-1} \quad (17)$$

When t=1:

$$A_1 = S_2; \quad (18)$$

$$\Phi_0 = A_1\sigma_0, \Phi_1 = A_1; \quad (19)$$

$$\Omega_0 = A_1\sigma_0 S_1 = A_1\omega_0. \quad (20)$$

When t=2:

$$A_2 = S_2 S_4 + (S_3)^2; \quad (21)$$

$$\Phi_0 = A_2\sigma_0, \Phi_1 = A_2\sigma_1, \Phi_2 = A_2; \quad (22)$$

$$\Omega_0 = A_2\sigma_0 S_1 = A_2\omega_0 \quad \Omega_1 = A_2\sigma_0 S_2 + A_2\sigma_1 S_1 = A_2\omega_1. \quad (23)$$

When t=3:

$$A_3 = S_2 S_4 S_6 + S_3 S_4 S_5 + S_3 S_4 S_5 + S_4 S_4 S_4 + S_3 S_3 S_6 + S_2 S_5 S_5; \quad (24)$$

$$\Phi_0 = A_3\sigma_0, \Phi_1 = A_3\sigma_1, \Phi_2 = A_3\sigma_2 \; \Phi_3 = A_3; \quad (25)$$

$$\Omega_0 = A_3\sigma_0 S_1 = A_3\omega_0, \; \Omega_1 = A_3\sigma_0 S_2 + A_3\sigma_1 S_1 = A_3\omega_1;$$

$$\Omega_2 = A_3\sigma_0 S_3 + A_3\sigma_1 S_2 + A_3\sigma_2 S_1 = A_3\omega_2. \quad (26)$$

Figure 7:
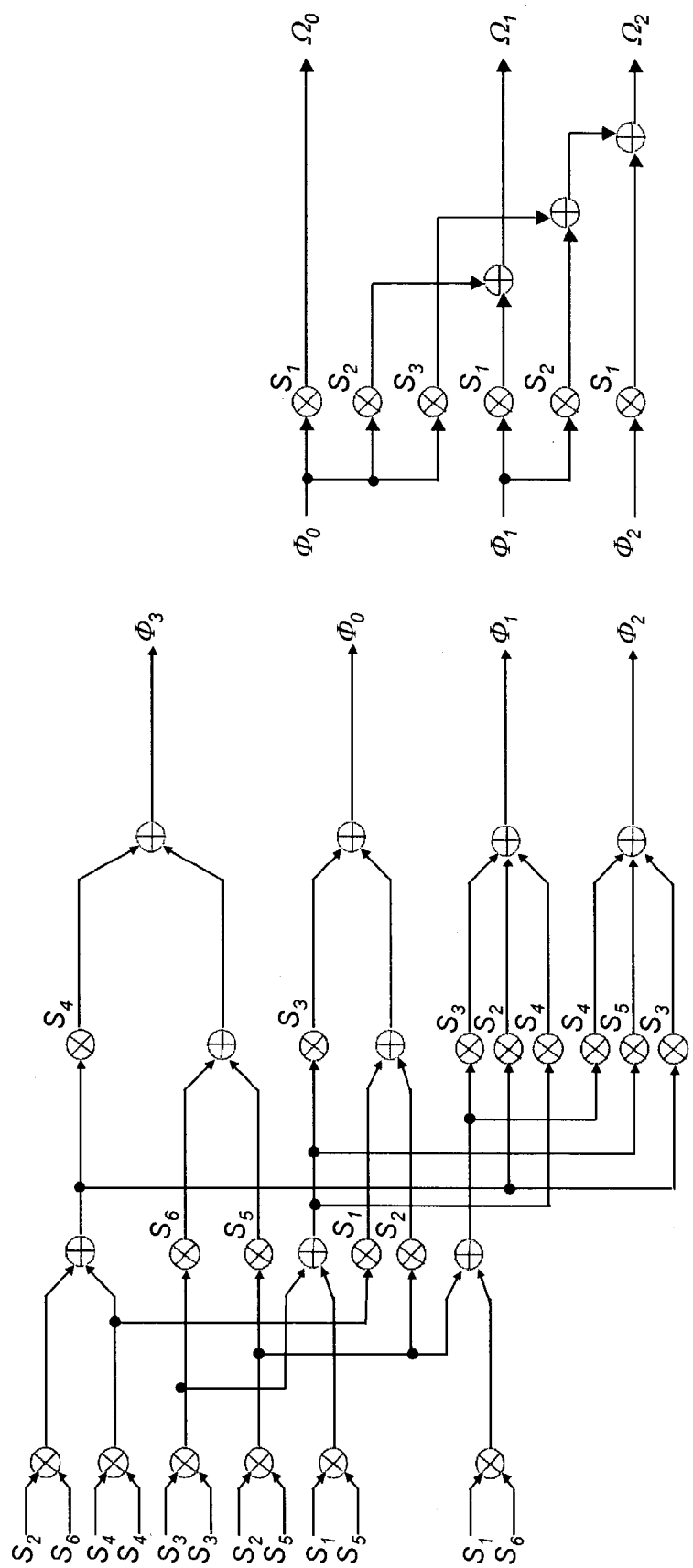
FIG. 7 shows an RTL hardware architecture of the simplified t=3 PGZ decoding architecture that does not need FFI operations according to one embodiment of the present invention.

In comparison with the conventional PGZ algorithm for computing $\sigma$ for t=3, the invention greatly simplifies the PGZ algorithm so that the FFI operation is not needed when computing $\Phi$ for t=3. The RTL hardware of the simplified PGZ algorithm that does not need FFI operations for t=3 is shown in FIG. 7, which only requires:

FFA×12; FFM×24; FFI×0

Figures 2, 3:
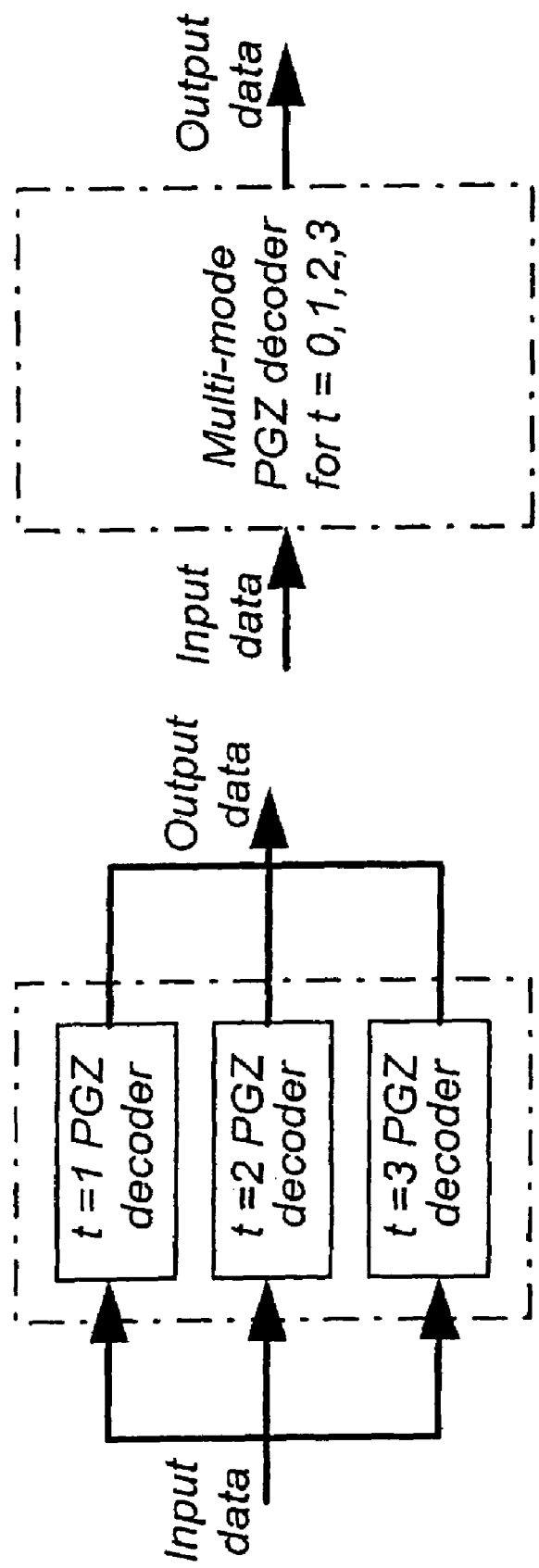
FIG. 2 is a circuit block diagram for the conventional PGZ decoding architecture that uses the duplicate hardware circuits to achieve error corrections.
FIG. 3 is a circuit block diagram of the multi-mode PGZ decoder with a single hardware to perform different error corrections according to one embodiment of the present invention.

However, the conventional PGZ architecture utilizes the redundant hardware circuits to achieve different error-correcting abilities (t≦3), as shown in FIG. 2. An objective of the invention is to use a single hardware circuit to achieve all theses error-correcting abilities (t=0,1,2,3), as shown in FIG. 3.

Furthermore, for the conventional PGZ algorithm, the PGZ decoding circuit for t=3 cannot correctly solve the t=1, 2 error(s). This is because when t is less than 3, divided-by-zero problems occur. For t=3, the equation to be solved is:

$$\begin{bmatrix} S_2 & S_3 & S_4 \\ S_3 & S_4 & S_5 \\ S_4 & S_5 & S_6 \end{bmatrix} \begin{bmatrix} \sigma_2 \\ \sigma_1 \\ \sigma_0 \end{bmatrix} = \begin{bmatrix} -S_1 \\ -S_2 \\ -S_3 \end{bmatrix}. \quad (27)$$

If the number of error is less than 3, the rows or columns in the matrix $S_{3\times 3}$ will be linearly dependent; that is $$\begin{bmatrix} S_2 \\ S_3 \\ S_4 \end{bmatrix} = \alpha \begin{bmatrix} S_3 \\ S_4 \\ S_5 \end{bmatrix} = \beta \begin{bmatrix} S_4 \\ S_5 \\ S_6 \end{bmatrix},$$

where $\alpha$ and $\beta$ are constants.

Accordingly, the denominator and the three numerators in Eq. (12) will be 0. In other words, $$S_2 S_4 S_6 + S_4 S_4 S_4 + S_3 S_3 S_6 + S_2 S_5 S_5 = 0$$

$$S_1 S_3 S_5 + S_1 S_4 S_4 + S_2 S_2 S_5 + S_3 S_3 S_3 = 0$$

$$S_2 S_2 S_6 + S_1 S_4 S_5 + S_3 S_3 S_4 + S_2 S_4 S_4 + S_1 S_3 S_6 + S_2 S_3 S_5 = 0$$

$$S_1 S_4 S_6 + S_2 S_4 S_5 + S_3 S_3 S_5 + S_1 S_5 S_5 + S_2 S_3 S_6 + S_3 S_4 S_4 = 0 \quad (28)$$

Similarly, if the number of errors is less than 2, the two sets of denominators and numerators in Eq. (10) will be 0 too. That is, $$S_2 S_4 + S_3 S_3 = 0$$

$$S_1 S_3 + S_2 S_2 = 0$$

$$S_1 S_4 + S_2 S_3 = 0 \quad (29)$$

Once divided-by-zero problems occur when computing σ, the conventional PGZ algorithm cannot perform error corrections. To solve this problem, the prior art requires the use of the redundant duplicate hardware circuits, as shown in FIG. 2. A state machine that checks error states is employed to correct different numbers of errors.

In order to correct different numbers of errors using a single hardware circuit, the invention extracts important information from Eqs. (28) and (29). Such information can be used to find out the number of errors. Explicitly,
when t=0: $S_2$=0;
when t=0,1: $S_2S_4+S_3S_3$=0;
when t=0,1,2: $S_2S_4S_6+S_4S_4S_4+S_3S_3S_6+S_2S_5S_5$=0

From Eq. (15), the following expressions are obtained:

$$A_1=S_2;$$

$$A_2=S_2S_4+S_3S_3;$$

$$A_3=S_2S_4S_6+S_4S_4S_4+S_3S_3S_6+S_2S_5S_5.$$

Figure 8:
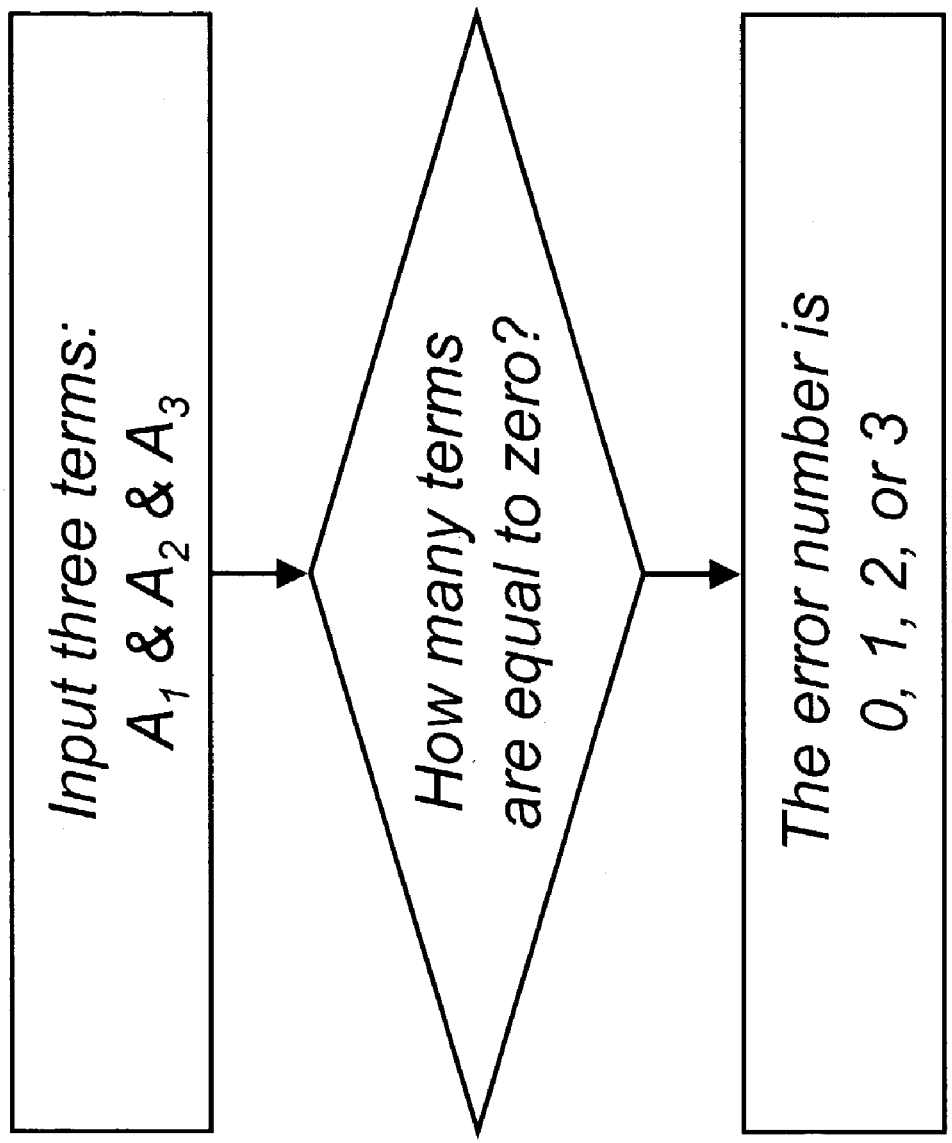
FIG. 8 shows a flowchart of the multi-mode decoding method according to one embodiment of the present invention.

Therefore, using $A_1$, $A_2$, and $A_3$ can determine the number of errors. Multi-mode decoding procedure based on the simplified PGZ algorithm is shown in FIG. 8.

Figure 9:
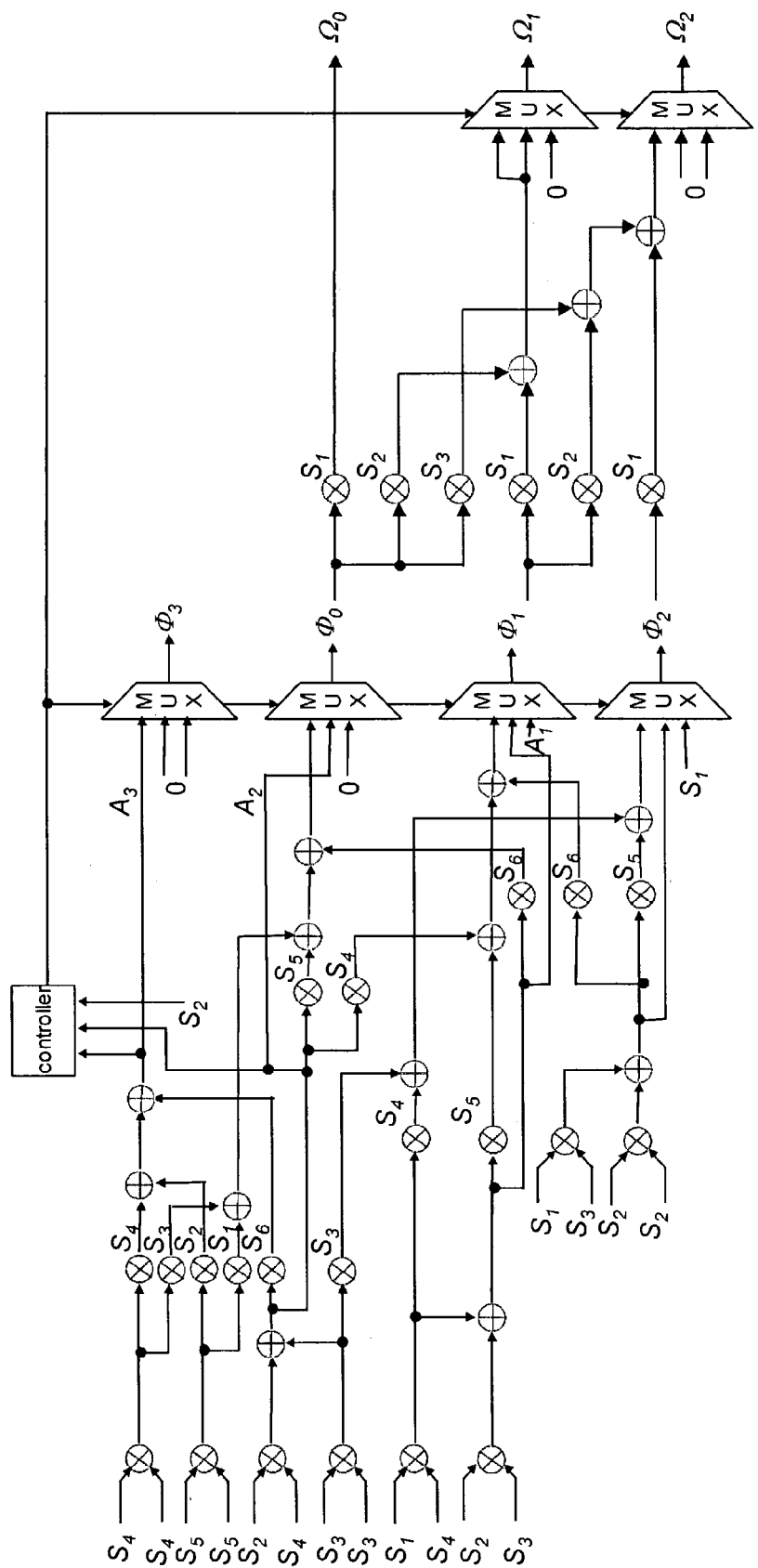
FIG. 9 shows an RTL hardware architecture of the multi-mode PGZ decoding architecture according to one embodiment of the present invention.

The simplified t=3 PGZ algorithm shown in FIG. 7 implements the RTL hardware without FFI operations. A controller 107 is capable of obtaining the number of errors as shown in FIG. 8. The multi-mode PGZ decoder 100 accomplishes the goal of using one circuit to solve different errors (t≦3). FIG. 9 shows an RTL hardware embodiment of the multi-mode PGZ decoder 100 according to the present invention, which includes:

FFA×15; FFM×27; FFI×0

Based upon the simplified PGZ algorithm, the Reed-Solomon decoding procedure according to the present invention comprises the steps of: computing the syndrome of received data; solving a key equation; and evaluating error locations and error value, wherein the step for solving the key equation is based upon the simplified PGZ algorithm. For t=3 PGZ algorithm, one first computes the common term of σ(x) in the error location polynomial (12) to reduce the number of the required FFA and FFM. Then perform a solving procedure without requiring FFI operations. This greatly reduces the calculation complexity and the occupied die area. In the invention, a multi-mode decoding method uses the determinant $A_t$ to determine the number of errors for implementing the multi-mode Reed-Solomon decoding procedure.

In another embodiment of the invention, the multi-mode Reed-Solomon decoder comprising: a syndrome calculator 101 to calculate syndromes of received data; a key equation solver 102 to receive a syndrome equation output from the syndrome calculator 101; and an error location and error value evaluator 103 to obtain the error locations and error value. The key equation solver uses a simplified PGZ decoder as the basis thereof. The improved PGZ decoder comprises FFA 104 and FFM 105 without requiring any FFI 106. The PGZ decoder contains a multi-mode decoding controller 107, which determines the number or errors from the determinant value $A_t$ so that the improved PGZ decoder can simultaneously perform t=0,1,2,3 error corrections. Thus, the invention discloses a multi-mode PGZ decoder 100 to implement the key equation solver 102.

Effects of the Invention

In accordance with the invention, the multi-mode Reed-Solomon decoder and method are based upon a simplified PGZ algorithm to solve key equations. The key equation solver is a multi-mode PGZ decoder that includes FFA and FFM without the need of any FFI. The multi-mode PGZ decoder further comprises a multi-mode decoding controller, which determines the number of errors using the determinant value $A_t$, so that the improved PGZ decoder can perform error corrections with t=0,1,2,3. Therefore, the disclosed Reed-Solomon decoder lowers the cost and reduces the die size. The simplified PGZ algorithm also greatly reduces the calculation complexity, to enhance the operation speed of the key equation solver.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A Reed-Solomon decoding method based upon a simplified PGZ algorithm, wherein a syndrome polynomial S(x) of received data is computer for obtaining an error location polynomial σ(x) and an error value polynomial ω(x) to perform error corrections in the received data for at least one error(s) with a number no more than t; said Reed-Solomon decoding method comprising the steps of:
defining a syndrome matrix $S_{t \times t}$ and a syndrome vector $s_{t \times 1}$ from the syndrome polynomial S(x) to solve $S_{t \times t} \sigma_{t \times 1} = s_{t \times 1}$; and
solving a determinant $A_t$ of the syndrome matrix $S_{t \times t}$ to define a new error location polynomial Φ(x)=$A_t$σ(x) and Ω(x)=$A_t$ω(x), which are then used to obtain error location(s) and error value(s) purely utilizing finite field adders and finite field multipliers without finite field inverters,
wherein the defining step further includes a step of determining the number of errors t by checking whether the rows in the syndrom matrix $S_{t \times t}$ are linearly dependent.

2. The method of claim 1, wherein the step of determining the number of errors t further includes a step of solving the determinant $A_t$ of the syndrome matrix $S_{t \times t}$ and assigning t=1 if $A_1 \neq 0$, t=2 if $A_2 \neq 0$, and t=3 if $A_3 \neq 0$.

3. A multi-mode Reed-Solomon decoder for error corrections for received data with no more than t errors, where t is a positive integer; the multi-mode Reed-Solomon decoder comprising:
a syndrome calculator, which computers a syndrome polynomial S(x) of the received data;
a key equation solver, which has a multi-mode decoding controller and is coupled to the syndrom calculator, for obtaining an error location polynomial σ(x) and an error value polynomial ω(x) by solving the syndrome polynomial S(x); and
an evaluator, which is coupled to the key equation solver to obtain an error pattern from the error location polynomial σ(x) and the error value polynomial ω(x);
wherein the key equation solver is based upon PGZ algorithm with a register transistor level (RTL) architecture which includes finite field adders (FFA) and finite field multipliers (FFM) without finite field inverters (FFI); and the multi-mode decoding controller defines a syndrome matrix $S_{t \times t}$ from the syndrome polynomial S(x) and a determinant $A_t$ of the syndrome matrix $S_{t \times t}$ is computed to determine the number of errors t, so as to enable an associated decoding circuit for the multi-mode Reed-Solomon decoder to perform multi-mode error corrections.

4. The multi-mode Reed-Solomon decoder of claim 3 wherein multi-mode error corrections with t=1, 2, 3 are performed.

5. The multi-mode Reed-Solomon decoder of claim 3 wherein the multi-mode decoding controller receives the determinant $A_1$, $A_2$, $A_3$ of the syndrome matrix $S_{t \times t}$ to determine the number of errors t no more than 3, thereby enabling said associated decoding circuit.

6. The multi-mode Reed-Solomon decoder of claim 5, wherein the key equation solver is capable of obtaining the error locations and error value for t=1, 2, 3, according to the number of errors t output from the multi-mode decoding controller.

7. A multi-mode Reed-Solomon decoder for error corrections for received data with no more than t errors, wherein t is a positive integer; the multi-mode Reed-Solomon decoder comprising:

a syndrome calculator, which computers a syndrome polynomial S(x) of the received data;

a key equation solver, which has a multi-mode decoding controller and is coupled to the syndrom calculator to solve the syndrome equation S(x) for an error location polynomial σ(x) and an error value polynomial ω(x); and an evaluator, which is coupled to the key equation solver to obtain an error pattern from the error location polynomial σ(x) and the error value polynomial ω(x);

wherein the key equation solver is based upon a PGZ decoder, the operation of the PGZ decoder improves calculation efficiency by eliminating finite field inverters, and the multi-mode decoding controller defines a syndrome matrix $S_{t \times t}$ from the syndrome polynomial S(x) and a determinant $A_t$ of the syndrome matrix $S_{t \times t}$ is computed to determine the number of errors t, so as to enable an associated decoding circuit for the multi-mode Reed-Solomon decoder to perform multi-mode error corrections.

* * * * *